United States Patent [19]

Yun

[11] Patent Number: 5,796,600
[45] Date of Patent: Aug. 18, 1998

[54] CHARGE PUMP CIRCUIT FOR IMPROVING A CHARGING SPEED

[75] Inventor: Jung Hee Yun, Kuri-Shi, Rep. of Korea

[73] Assignee: Hyundai Electronics Industries Co., Ltd., Kyungki-Do, Rep. of Korea

[21] Appl. No.: 789,088

[22] Filed: Jan. 27, 1997

[30] Foreign Application Priority Data

Jan. 26, 1996 [KR] Rep. of Korea .................. 96-01663

[51] Int. Cl.$^6$ ............................................. H02M 3/07
[52] U.S. Cl. ............................ 363/60; 363/59; 327/536
[58] Field of Search .................... 363/59, 600; 327/536

[56] References Cited

U.S. PATENT DOCUMENTS

| | | | |
|---|---|---|---|
| 4,792,705 | 12/1988 | Ouyang et al. | 307/296 R |
| 4,839,787 | 6/1989 | Kojima et al. | 363/60 |
| 5,444,362 | 8/1995 | Chung et al. | 327/536 |
| 5,561,597 | 10/1996 | Limpaecher | 363/59 |
| 5,572,414 | 11/1996 | Komori | 363/60 |
| 5,625,544 | 4/1997 | Kowshik et al. | 363/60 |
| 5,629,843 | 5/1997 | Loughmiller et al. | 363/59 |

*Primary Examiner*—Jeffrey L. Sterrett
*Attorney, Agent, or Firm*—Scott C. Harris, Esq.

[57] ABSTRACT

The present invention relates to the charge pump circuit and, more particularly to the charge pump circuit which can decrease the time period of voltage rise of the charge pump circuit by making the charge pumping voltage outputted from the output stage of the pump circuit section to be satisfactorily supplied to the load section, by making the rate of the gate voltage rise of the voltage drop transistor to be higher than the rate of drain voltage rise.

5 Claims, 5 Drawing Sheets

CHARGE PUMP CIRCUIT FOR IMPROVING A CHARGING SPEED

BACKGROUND OF THE INVENTION

1. Field of the Invention

The present invention relates to a charge pump circuit and, more particularly to a charge pump circuit which can be used in a flash memory device such as an EEPROM, etc.

2. Information Disclosure Statement

In general, the charge pump circuit is a circuit used to temporarily supply a higher voltage than a power source voltage. That is, the charge pump circuit is used in a back-bias voltage generator of a semiconductor device such as DRAM and in a voltage generator necessary to write or erase an EPROM, EEPROM and flash memory cell.

A convention charge pump circuit will now be described with reference to FIG. 1

The conventional charge pump circuit consists of a pump circuit section 5, rectifier circuit section 6, and load section 7. The pump circuit section 5 takes as an input the voltage supplied from a power source terminal Vcc and charge pumps to the rectifier circuit section 6. The rectifier circuit section 6 induce a required voltage and supplies it to the load section 7.

The pump circuit section 5 consists of a plurality of souring transistors Q01 to Q04 for maintaining each pumping node K1 to K4 at a constant voltage at the time of initial operation, a plurality of transfer transistors Q1 to Q4 for transferring the voltage of each pumping node K1 to K4 to an output terminal OUT1 by being turned on/turned off according to the input of a first and second clock signal PH1, PH2, and a plurality of coupling capacitors C11, C12, C21, C22 for charging or discharging the voltage of each pumping node K1 to K4 according to the first and second clock signal PH1, PH2. That is, pumping units 1 to 4, each consisting of the souring transistor, transfer transistor and coupling capacitor, are serially connected to each other. The operation of charge pumping of the pump circuit section 5 is described below.

Each pumping unit 1 to 4 is operated by the first and second clock signals PH1, PH2 which are two phase clock signals having a phase difference of 180° with respect to each other.

When the first clock signal PH1 is at Low state and the second clock signal PH2 is at High state, the souring transistors Q01 to Q04 taking as input the voltage supplied from the power source terminal Vcc are turned on, and the voltage supplied from the power source terminal Vcc via the sourcing transistors Q01, Q03 is charged to the coupling capacitors C11, C12.

Thereafter, when the first clock signal PH1 transits to High state and the second clock signal PH2 transits to Low state, the charged coupling capacitors C11, C12 start discharging so that the potential of the pumping nodes K1, K3 is raised up. At this time the coupling capacitors C21, C22 start charging, and the voltage of the nodes K1, K3 supplied through the transfer transistor Q1, Q3 and the voltage supplied from the power source terminal Vcc through the sourcing transistors Q02, Q04 are charged to the coupling capacitors C21, C22. Since the pumping operation proceeds according to the clock, the voltage at the last output terminal is temporarily increased as the number of clocks is increased. That is, the voltage is charged from a previous stage to the next stage through the transfer transistors. Therefore, as the time period of pumping increases, not only the potential at each pumping node is increased but also the potential is increased going from the first stage to the last stage. A certain potential difference exists between the previous stage and the next stage. Therefore, a certain number of pumping units are required to obtain a certain output voltage within a given time period.

On the other hand, a diode d1 in the rectifier circuit section 6 is a reverse P-N junction diode which is connected between a drain and bulk of NMOS transistor and has a breakdown voltage characteristics of a certain level. NMOS transistors Q5 to Qn are transistors for voltage drop from the breakdown voltage level to an aimed voltage level.

The conventional charge pump circuit constructed as described above has a voltage characteristic curve shown in FIG. 2. In general, since the breakdown voltage Vbv is higher than the target voltage Vpg, NMOS transistors Q5 to Qn are used for voltage drop. Accordingly, the output terminal OUT2 of the rectifier circuit section 6 has a delay in time of $\Delta t(=t_2-t_1)$ corresponding to at least the voltage drop of $\Delta V=(=n \times Vtn)$ of NMOS transistors Q5 to Qn compared to the output terminal OUT1 of the pump circuit section 5. Here, n is the number of transistors and Vtn represents the threshold voltage of the transistors. That is, NMOS transistor Q5 remains turned off until the drain(or gate) voltage of NMOS transistor Q5 becomes higher than the threshold voltage Vtn. Therefore, initially the charged voltage is not Supplied to the load section 7 from the rectifier circuit section 6.

Since the conventional charge pump circuit operating as described above uses voltage drop method to obtain a required voltage, there is a disadvantage in that a part of the voltage is exhausted by the P-N junction transistor at the time of junction breakdown so as to delay the time of voltage rise.

SUMMARY OF THE INVENTION

Therefore, the object of the present invention is to provide a charge pump circuit which can raise the voltage of the load section without time delay by making the charge pumping voltage outputted from the pump circuit section to be satisfactorily supplied to the load section, by making the gate voltage rise rate of the voltage drop transistor to be higher than the drain voltage rise rate.

The present invention to accomplish the above described object is characterized in that it comprises a pump circuit section comprising a first and second positive charge pumps which take as inputs a first and second clock signals, respectively, which are connected in parallel and which each outputs the charge pumping voltage to a first output stage according to the first and second clock signal; a rectifier circuit section which takes as an input the charge pumping voltage outputted from the first output stage of the pump circuit section, and which outputs the charge pumping voltage to a second output stage according to the first and second clock signals; and a load section which takes as an input the charge pumping voltage outputted from the second output stage of the rectifier circuit section.

BRIEF DESCRIPTION OF THE DRAWINGS

For fuller understanding of the nature and object of the invention, reference should be had to the following detailed description taken in conjunction with the accompanying drawings in which.

Similar reference characters refer to similar parts in the several views of the drawings.

DETAILED DISCRIMINATION OF THE DRAWINGS

The present invention will be described in detail with reference to the accompanying drawings.

Figure 3:
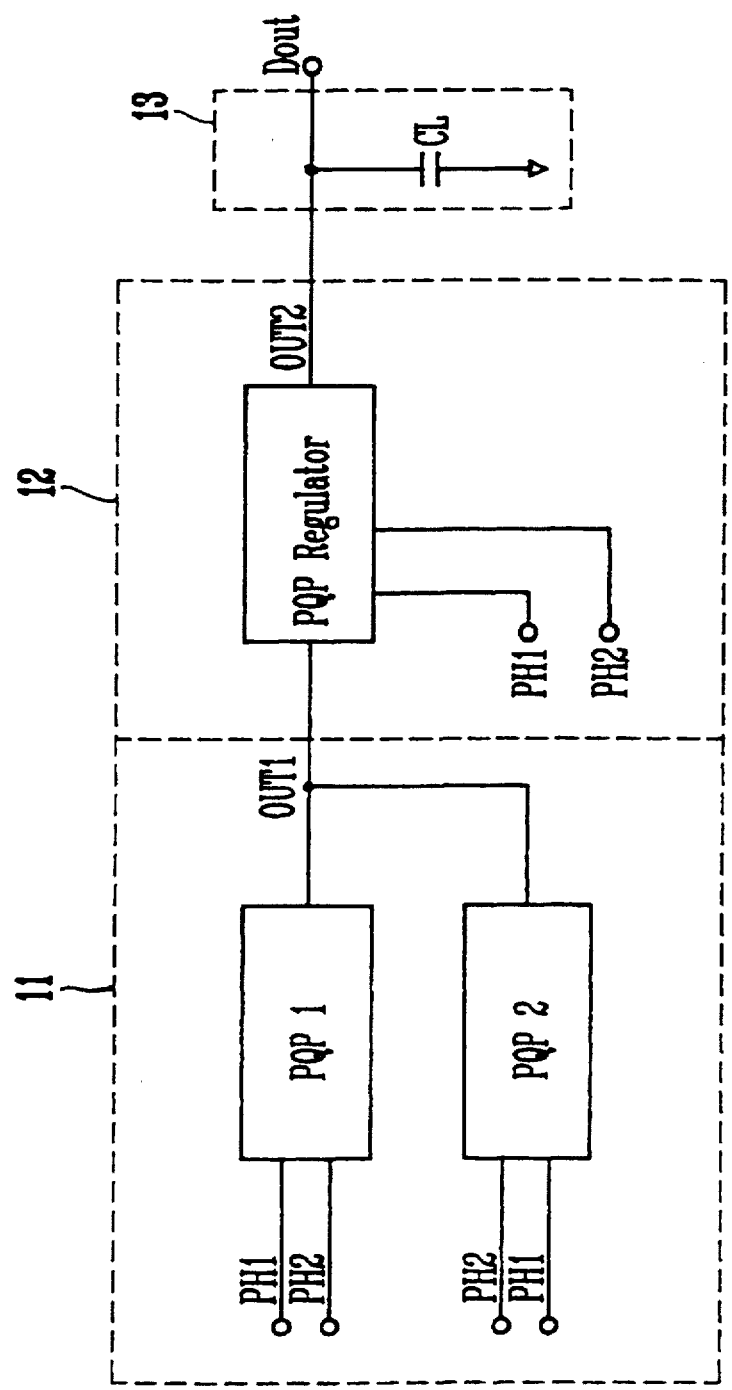
FIG. 3 is a block diagram of a charge pump circuit according to the present invention.

FIG. 3 is a block diagram of a charge pump circuit according to the present invention.

In the pump circuit section 11, a first and second positive charge pumps PQP1, PQP2, which take as inputs a first and second clock signals PH1, PH2 having a phase difference of 180° with respect to each other, are connected in parallel to efficiently supply the charged voltage. Output voltage of a first output stage OUT1 of the pump circuit section 11 is supplied to a rectifier circuit section 12 which takes as inputs the first and second clock signals PH1, PH2. Output voltage of a second output stage OUT2 of the rectifier circuit section 12 is supplied to a load section 13. A capacitor CL of the load section 13 is a capacitor for modeling an output Dout.

Figure 4:
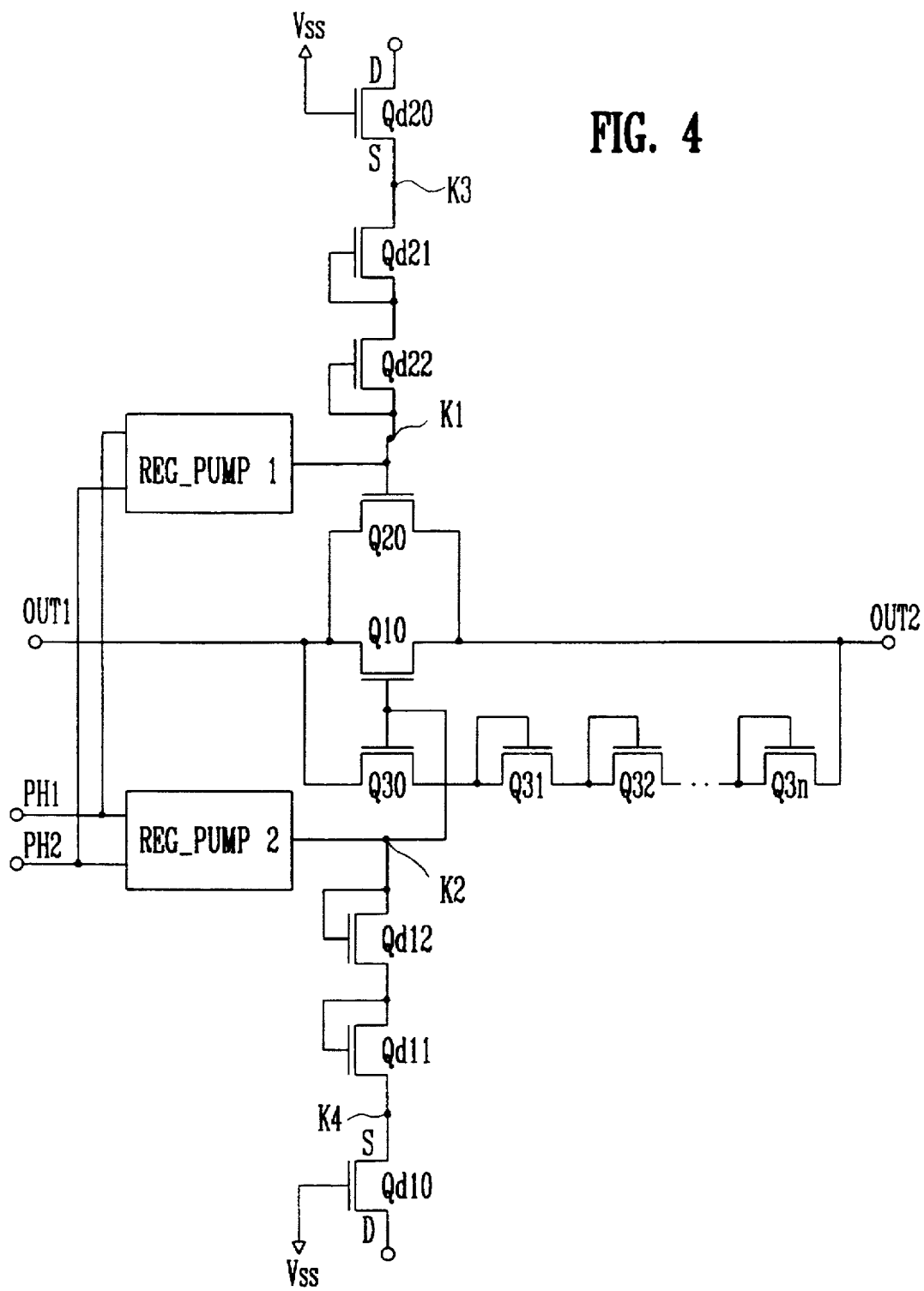
FIG. 4 is a detailed circuit diagram of a rectifier circuit section of FIG. 3.

FIG. 4 is a circuit diagram shown to illustrate in detail the rectifier circuit section of FIG. 3. The rectifier circuit section comprises a first transistor Qd2O in which a drain electrode D is floating, a source electrode S is connected to a node K3, and a gate electrode G is connected to a ground terminal Vss to induce a breakdown voltage; a second transistor Qd1O in which a drain electrode D is floating, a source electrode S is connected to a node K4, and a gate electrode G is connected to said ground terminal Vss to induce a breakdown voltage; a third and fourth transistors Qd21, Qd22 serially connected between said node K3 and a node K1 to induce a breakdown voltage higher than the breakdown voltage generated by the first transistor Qd2O; a fifth and sixth transistors Qd11, Qd12 serially connected between the node K4 and a node K2 to induce a breakdown voltage higher than the breakdown voltage generated by the second transistor Qd1O; a seventh and eighth transistors Q20, Q10 which are connected in parallel between said first and second output stages OUT1, OUT2 and which take as inputs the node K1 and K2, respectively; a ninth to nth transistors Q30 to Q3n which are serially connected between the first and second output stages OUT1, OUT2, wherein the ninth transistor Q30 takes as an input the node K2 and the tenth to nth transistors arc for voltage drop; and a first and second pump circuits(REG_PUMP1, REQ_PUMP2) 21, 22 which are connected to said node K1, K2, respectively, to raise gate voltages of said seventh, eighth and ninth transistors Q20, Q10, and Q30 transistors according to the input of said first and second clock signals PH1, PH2.

In such rectifier circuit section 12, an arbitrary breakdown voltage induced by the first transistor Qd20, in which the drain electrode D is floating, the source electrode S is connected to a node K3, and the gate electrode G is connected to the ground terminal Vss, is supplied to the node K3. The breakdown voltage induced by the second voltage Qd10, in which the drain electrode D is floating, the source electrode S is connected to the node K, and the gate electrode G is connected to the ground terminal Vss, is supplied to the node K. At this time, the third and fourth transistors Qd21, Qd22 induce the potential of the node K1 to the breakdown voltage higher than the breakdown voltage generated by the first transistor Qd20. The fifth and sixth transistors Qd1, Qd12 serially connected between the node K4 and node K2 induce the potential of the node K2 to the breakdown voltage higher than the breakdown voltage generated by the second transistor Qd10. Here, the number of the third, fourth, fifth and sixth transistor Qd21, Qd22, Qd11 and Qd12 can be adjusted according to the magnitude of the required breakdown voltage.

On the other hand, the charge pumping voltages supplied from the first and second positive charge pumps 21, 22 which take as inputs the first and second clock signals PH1, PH2, respectively, are supplied to the nodes K1, K2, respectively. Therefore, the seventh, eighth and ninth transistors Q20, Q10 and Q30 which take as inputs the node K1, K2 are turned on so that the charged voltage outputted from the first output stage OUT1 of the pump circuit section 11 is supplied to the second output stage OUT2 of the rectifier circuit section 12.

Figure 1:
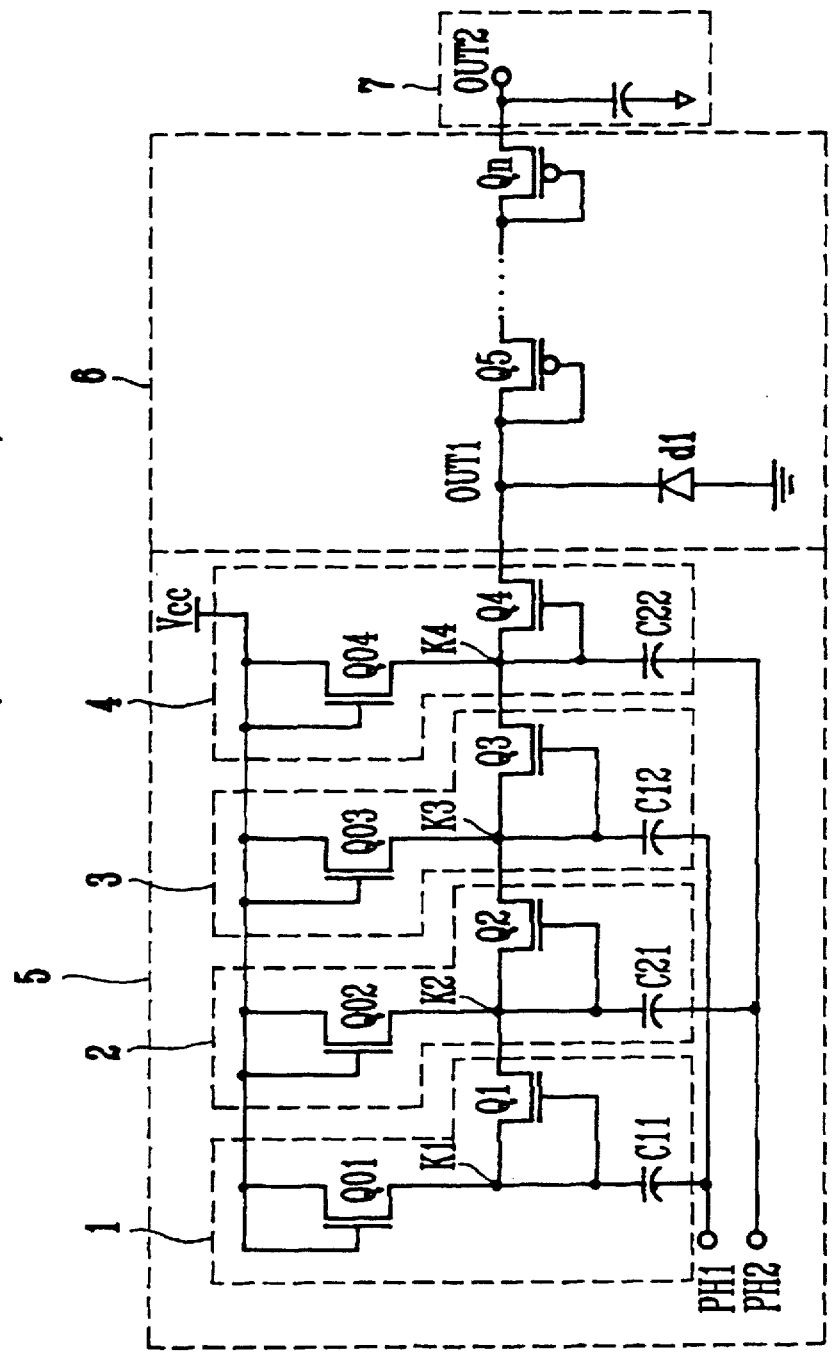
FIG. 1 is a circuit diagram of a conventional charge pump circuit.
Figure 2:
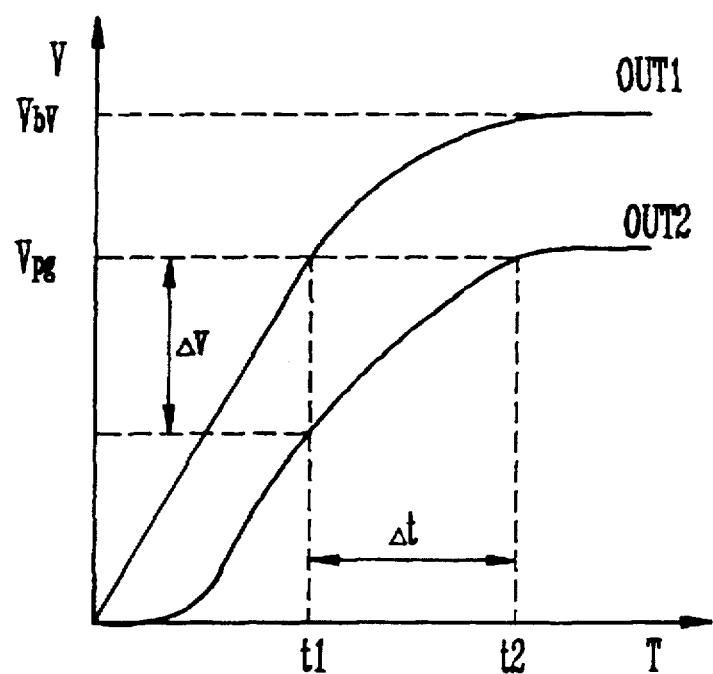
FIG. 2 is a graph of characteristics of the conventional charge pump circuit.
Figure 5:
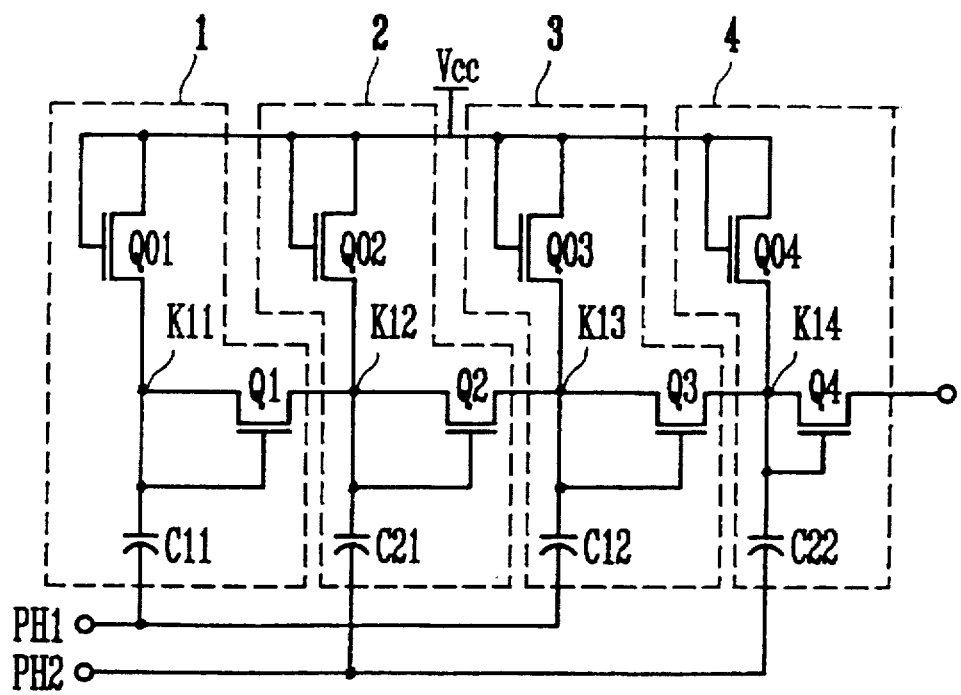
FIG. 5 is a detailed circuit diagram of a charge pump circuit section of FIG. 3.

FIG. 5 is a detailed circuit diagram of the first or second pump circuit of the rectifier circuit section of FIG. 4. The first or second pump comprises a plurality of souring transistors Q01 to Q04 for maintaining constant voltage at each pump node K1 to K4 a plurality of transfer transistors Q1 to Q4 for transferring the voltage of each the pumping node K1 to K4 by being turned on/turned off according to the input of the first and second clock signals PH1, PH2 and a plurality of coupling capacitors C11, C12, C21, C22 for charging or discharging the voltage of each said pumping node K1 to K4 according to the first and second clock signals PH1, PH2. The charge pumping operation of such pump circuit section is same as the pumping operation of FIG. 1.

Figure 6:
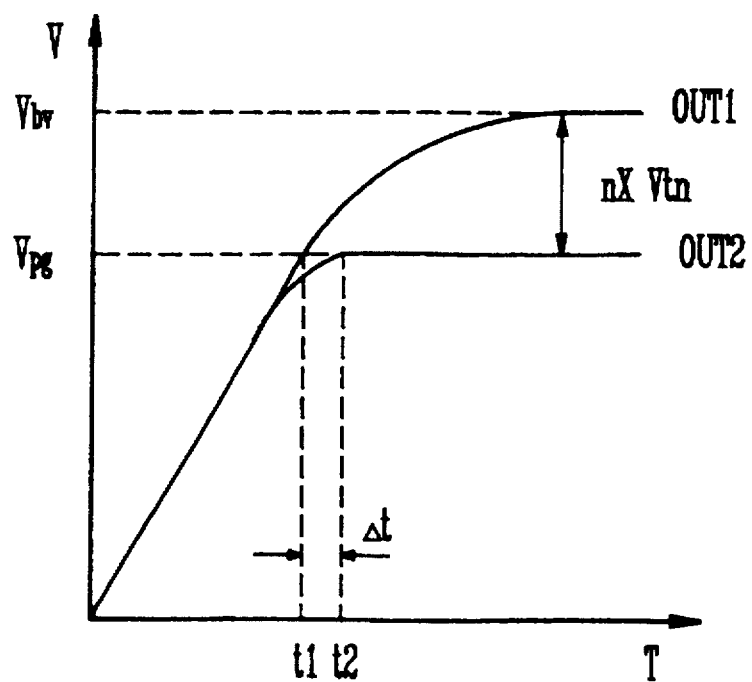
FIG. 6 is a graph of characteristics of the charge pump circuit according to the present invention.

FIG. 6 is a graph of characteristics of the charge pump circuit according to the present invention. The delay time Δt taken when the voltage is raised from the first output stage OUT1 of the pump circuit section 11 to the voltage of the second output stage OUT2 of the rectifier circuit section 12 can be reduced to the minimum since the seventh eighth and ninth transistors Q20, Q10, and Q30 of the rectifier circuit section 12 are rapidly turned on by the gate voltage rise rate. In addition, the aimed program voltage Vpg is decided by the voltage drop transistor Q30 to Q3n.

As described above, according to the present invention, there is an excellent effect that the voltage rise time period of the charge pump circuit can be reduced by making the charge pumping voltage outputted from the output stage of the pump circuit section to be satisfactorily supplied to the load section, by making the gate voltage rise rate of the voltage drop transistor to be higher than the drain voltage rise rate.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A charge pump circuit comprising:

a pump circuit section comprising a first and second positive charge pumps which take as inputs a first and second clock signals, respectively, which are connected in parallel and which each outputs the charge pumping voltage to a first output stage according to said first and second clock signals;

a rectifier circuit section which takes as an input said charge pumping voltage outputted from said first output stage of said pump circuit section, and which outputs said charge pumping voltage to a second output stage according to said first and second clock signals; and a load section which takes as an input said charge pumping voltage outputted form said second output stage of said rectifier circuit section.

2. The charge pump circuit of claim 1, wherein said first and second clock signals are two-phase clock signals which have phases which have a phase difference of 180° between them.

3. The charge pump circuit of claim 1, wherein said rectifier circuit section comprises:

a first transistor in which a drain electrode is floating, a source electrode is connected to a third node, and a gate electrode is connected to a ground terminal to induce a breakdown voltage;

a second transistor in which a drain electrode is floating, a source electrode is connected to a fourth node, and a gate electrode is connected to said ground terminal to induce a breakdown voltage;

a third and fourth transistors serially connected between said third node, and a first node;

a fifth and sixth transistors serially connected between said fourth node and a second node;

a seventh and eight transistors which are connected in parallel between said first and second output stages and which take as inputs said first node and second node, respectively;

a ninth to nth transistors which are serially connected between said first and second output stages, wherein said ninth transistor takes as an input said second node and said tenth to nth transistors are for voltage drop; and a first and second pump circuits which are connected to said first and second nodes, respectively, and which take as inputs said first and second clock signals.

4. The charge pump circuit of claim 3, wherein each of said first and second pump circuits comprises:

a plurality of souring transistors for maintaining constant voltage at each pump node at the time of initial operation;

a plurality of transfer transistors for pumping the voltage by being turned on/turned off according to the input of said first and second clock signals; and a plurality of coupling capacitors for charging or discharging each of said pumping node voltages according to said first and second clock signals.

5. The discharge pump circuit of claim 3, wherein said first and second pump circuits can raise gate voltages of said seventh, eighth and ninth transistors independently of the rise of drain voltage of said seventh, eighth and ninth transistors according to the input of said first and second clock signals.

* * * * *